United States Patent
Pooranakaran et al.

(10) Patent No.: US 7,173,438 B2
(45) Date of Patent: Feb. 6, 2007

(54) MEASURING CAPACITANCE

(75) Inventors: Pooranampillai Samuel Pooranakaran, Singapore (SG); Vasudevan Seshadri Kumar, Singapore (SG); Manoj Kumar Dey, Singapore (SG); Chung See Fook, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 11/132,138

(22) Filed: May 18, 2005

(65) Prior Publication Data
US 2006/0267599 A1    Nov. 30, 2006

(51) Int. Cl.
*G01R 27/26* (2006.01)

(52) U.S. Cl. .................. 324/678; 324/677; 324/681; 324/519

(58) Field of Classification Search ............. 324/678, 324/681, 677, 519
See application file for complete search history.

(56) References Cited

U.S. PATENT DOCUMENTS

| | | | |
|---|---|---|---|
| 4,216,424 A | 8/1980 | Vette | |
| 4,458,196 A | 7/1984 | Goyal et al. | |
| 4,550,406 A * | 10/1985 | Neal | 714/734 |
| 5,093,627 A | 3/1992 | Kitayoshi | |
| 5,256,975 A * | 10/1993 | Mellitz et al. | 324/519 |
| 5,502,375 A | 3/1996 | Marek | |
| 5,844,412 A | 12/1998 | Norton | |
| 6,054,864 A | 4/2000 | Butts | |
| 6,191,723 B1 * | 2/2001 | Lewis | 341/166 |
| 6,198,290 B1 | 3/2001 | Krinker | |
| 6,356,086 B1 | 3/2002 | Cook et al. | |
| 6,420,882 B1 * | 7/2002 | Engebretsen et al. | 324/667 |
| 6,469,516 B2 | 10/2002 | Nishioka et al. | |
| 6,522,148 B2 * | 2/2003 | Ochiai et al. | 324/428 |
| 6,737,875 B2 | 5/2004 | Davis et al. | |
| 6,798,213 B2 | 9/2004 | Ngo | |
| 6,822,461 B2 * | 11/2004 | Klun | 324/698 |
| 2004/0004488 A1 * | 1/2004 | Baxter | 324/678 |
| 2005/0104604 A1 * | 5/2005 | Mellert et al. | 324/678 |

OTHER PUBLICATIONS

RC Circuits, 2001 Summer, http://www.pa.msu.edu/courses/2001summer/PHY232/lectures/rccircuits/rc.html, pp. 1-2.*
"The Femto Capacitance Meter" by Gary Novak (50 Pages).

* cited by examiner

*Primary Examiner*—Andrew H. Hirshfeld
*Assistant Examiner*—John Zhu
(74) *Attorney, Agent, or Firm*—Shumaker & Sieffert, P.A.

(57) ABSTRACT

A method for determining capacitance includes alternately charging a capacitor to a first voltage and discharging the capacitor to a second voltage, generating an output signal having a frequency that is a function of a time period, and determining the capacitance based on the frequency of the output signal. The time period is selected from at least one of: (a) a time period needed to charge the capacitor from the second voltage to the first voltage and (b) a time period needed to discharge the capacitor from the first voltage to the second voltage.

16 Claims, 9 Drawing Sheets

MEASURING CAPACITANCE

TECHNICAL FIELD

This disclosure relates to measuring capacitance.

BACKGROUND

Electrical component testing in general, and capacitor testing in particular, may be important elements of a quality control program related to manufacturing electrical devices. Component testing in general can increase an electrical device's overall reliability by identifying components that are defective, improperly installed or that have parameters that fall outside of design specifications. Increasing product reliability can, in turn, reduce manufacturing costs that might otherwise be incurred in processing returns and in rework. The importance of component testing grows as electrical devices grow in complexity, and as components shrink in size.

Capacitor testing in particular may be important because many electrical device problems may be caused by defective or misplaced capacitors. Functional testing of an electrical device may not identify defective or misplaced capacitors. However, testing that includes measuring capacitance of individual capacitors may identify defective and misplaced capacitors. Consider, as an example, an electrical device that requires a capacitor with a particular capacitance value in order to properly decouple a proximately placed semiconductor device. An electrical device including an out-of-specification capacitor may pass functional testing before it leaves the manufacturer's facility, but the electrical device may fail intermittently in the field because of the out-of-specification capacitor. Capacitor testing that measures that capacitance values of capacitors may identify the out-of-specification capacitor before the electrical device leaves the manufacturer's facility, possibly eliminating a field failure, a return and rework costs.

SUMMARY

This disclosure relates to measuring capacitance. In a first general aspect, a method for determining capacitance includes alternately charging a capacitor to a first voltage and discharging the capacitor to a second voltage, generating an output signal having a frequency that is a function of a time period, and determining the capacitance based on the frequency of the output signal. The time period is selected from at least one of: (a) a time period needed to charge the capacitor from the second voltage to the first voltage and (b) a time period needed to discharge the capacitor from the first voltage to the second voltage.

In a second general aspect, an apparatus for determining capacitance of a capacitor includes: (a) a charging circuit that includes a voltage source, the charging circuit being selectably coupleable to a capacitor, such that when the charging circuit is coupled to the capacitor, the capacitor is charged by the voltage source until voltage across the capacitor is substantially equal to a first voltage value; (b) a discharging circuit that includes a discharging impedance that is selectably coupleable to the capacitor, such that when the discharging circuit is coupled to the capacitor, the capacitor is discharged through the discharging impedance until the voltage across the capacitor is substantially equal to a second voltage value; (c) a control circuit that determines, based on the voltage across the capacitor, whether: (1) to couple the charging circuit to the capacitor; or (2) to couple the discharging circuit to the capacitor; or (3) to couple neither the charging circuit to the capacitor, nor to couple the discharging circuit to the capacitor; (d) an output signal-generating circuit that generates an output signal having a frequency that is a function of the capacitance of the capacitor; and (e) a capacitance-determining block that determines the capacitance based on the frequency of the output signal.

Advantages of using the systems and methods described herein may include any or all of the following. Some implementations may enable capacitance measurements of a capacitor to be made without turning on a semiconductor device that is electrically coupled to the capacitor. Some implementations may enable capacitance measurements of a capacitor to be made without reverse-biasing a device that is electrically coupled to the capacitor.

The details of one or more implementations are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1:
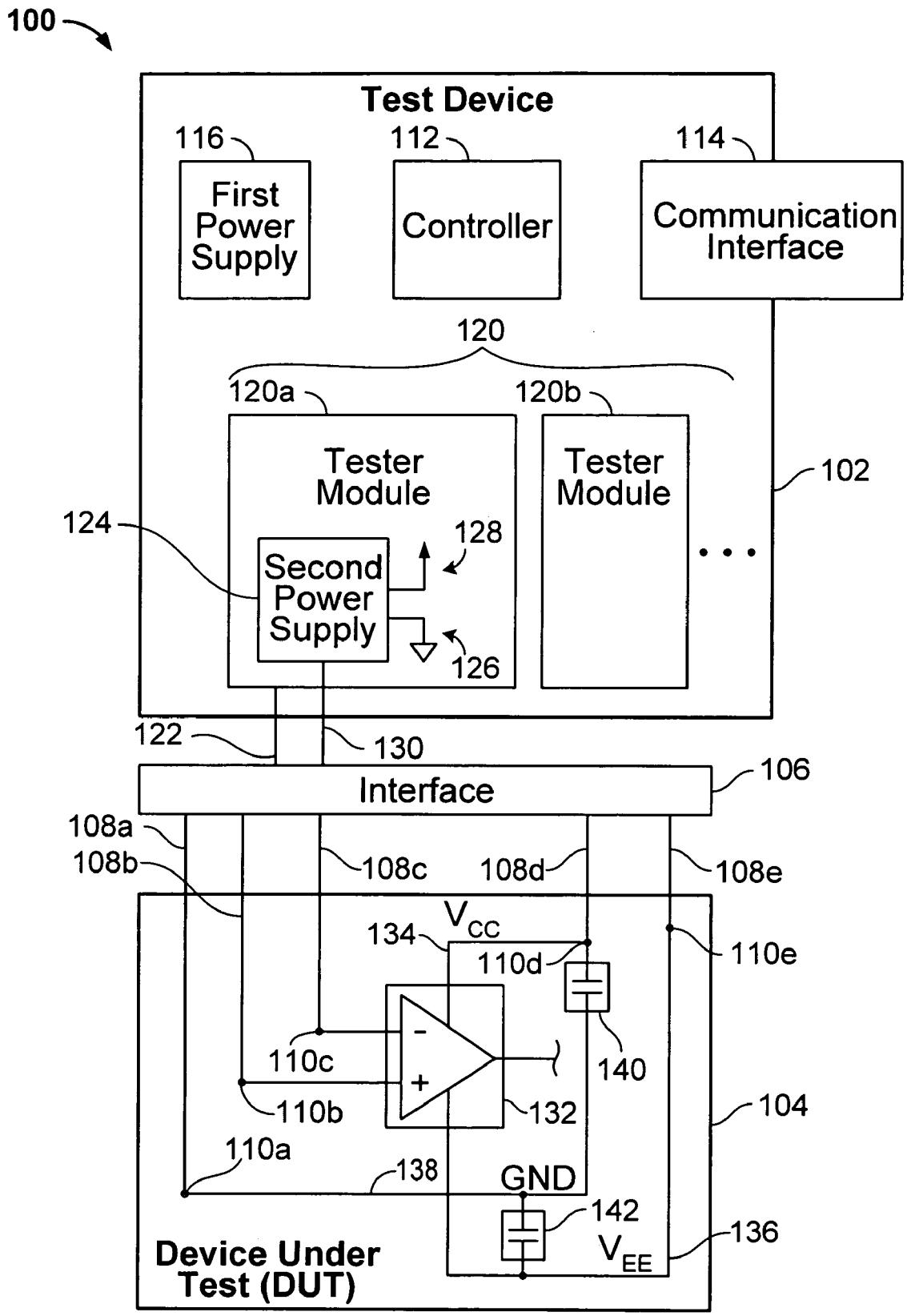
FIG. 1 is a block diagram of a test system in which a capacitance measurement device would function, according to one implementation.

FIG. 1 is a block diagram of a test system 100 in which a capacitance measurement device would function, according to one implementation. The test system may comprise a test device 102, a device under test (DUT) 104 and an interface 106 that couples the DUT 104 to the test device 102. The test device 102 may test one or more aspects of the DUT 104 to verify the integrity or functionality of the DUT 104.

The DUT 104 could be any kind of electrical device. For example, the DUT 104 could be a single layer or multi-layer printed circuit board (PCB). As another example, the DUT 104 could be a wire harness for coupling two or more electrical devices. As another example, the DUT 104 could be a backplane for connecting two or more PCBs to a common power supply and signal bus. As another example, the DUT 104 could be a combination wire harness and a PCB, such as a printed circuit cable assembly (PCCA). As another example, the DUT 104 could be an individual electrical component.

To verify the integrity or functionality of the DUT 104, the test device 102 may perform a plurality of tests on the DUT 104. For example, the DUT 104 may be a PCB, and the test device 102 may verify continuity of various connections, or "nets," on the DUT 104 before any electrical components are installed. The test device 102 may be an in-circuit tester, and may test the DUT 104 after electrical components are installed. For example, an in-circuit tester may apply signals to components comprising a "JTAG chain" (components with special test functionality meeting IEEE 1149.1 standards) to test continuity between the components and other nets to which the components are connected ("boundary scan" testing). After the electrical components are installed on the DUT 104, the test device 102 may apply a plurality of signals to the DUT 104 to verify functionality of whole subsystems on the DUT 104. The test device 102 may also probe specific devices on the DUT 104 to verify certain parameter values. For example, the test device 102 may probe an individual capacitor on a DUT 104 to determine its capacitance value.

The test device 102 may be manually operated, or it may be part of automated test equipment (ATE) such as an automated in-circuit tester. For example, the test device 102 could be an automated part of a manufacturing line for a PCCA for a disk drive. The automated tests could, for example, verify continuity between the endpoints of the cable assembly, functionality of active components on the PCCA and parameter values of the passive components on the PCCA.

The interface 106 couples the DUT 104 to the test device 102, according to one implementation. The interface 106 may also mechanically secure and position the DUT 104 for testing. For example, the interface 106 may comprise a "clamshell" fixture that grips a PCB or a PCCA from one or more directions. Some clamshell fixtures may electrically couple various nets on the DUT 104 with the test device 102 while simultaneously retaining the DUT 104 mechanically. The interface 106 may include a series of probes 108a–108e that electrically contact various test points 110a–110e on the DUT 104. The probes 108a–108e may, for example, comprise a "bed of nails." The test points 110a–110e may be conductive areas on the surface of the DUT 104 designed to facilitate reliable electrical coupling to the probes 108a–108e. For example, the test points 110a–110e may be exposed pads of copper on a PCB or PCCA. The interface 106 may position the DUT 104 for inspection by part of the test device 102. For example, the interface 106 may secure the DUT 104 to permit a "flying probe" to electrically couple to various test points on the DUT 104. The interface 106 may permit other-than-electrical coupling between the test device 102 and the DUT 104. For example the test device 102 may comprise a camera and an image-recognition device that can verify that specific components are installed in the correct position and orientation on the DUT 104. The interface 106 may facilitate radio frequency (RF) communication, X-ray communication, or other forms of communication between the test device 102 and the DUT 104. The interface 106 may be specially designed for a particular DUT 104. For example, a bed-of-nails clamshell may be designed to test one particular PCCA. Or, the interface 106 may be more generic and able to facilitate testing of many different DUTs. For example, a flying probe interface may be able to test DUTs of various sizes and shapes.

Within the test device, a controller 112 manages the interactions of the test device 102 with the DUT 104, according to one implementation. The controller may be a computer device of the type shown in FIG. 5. The controller 112 may cause the execution of a single test or of a series of tests in sequence. The controller 112 may make a pass/fail determination for each of a plurality of components on a DUT 104 or for the DUT 104 as a whole. For example, the controller 112 may determine the capacitance of a plurality of capacitors on the DUT 104 and subsequently verify that the capacitance of each capacitor is within a predetermined range. The range may be defined by a difference between the determined capacitance value and an expected capacitance value. If all of the determined capacitance values differ from the expected capacitance values by no more than a predetermined amount, the controller 112 may "pass" the DUT 104. Conversely, if the controller 112 identifies a capacitance value that differs from an expected capacitance value by more than the predetermined amount, the controller 112 may "fail" the DUT 104 and indicate which capacitance value is out of range. The controller 112 may display test result information, such as pass/fail determinations, through a communication interface 114. The controller 112 may also receive instructions through the communication interface 114.

The communication interface 114 may comprise a keyboard and a display, such as a cathode ray tube (CRT) or a liquid-crystal displace (LCD). The communication interface 114 may include a computer device that is coupled to the test device 102 through a peripheral port on the computer device such as a parallel port, a serial port or a universal serial bus (USB) port. The communication interface 114 may connect to other computer devices through a network, such as a local area network (LAN).

The test device 102 may include a first power supply 116. The first power supply 116 may supply power to the components of the test device 102. In certain implementations, the first power supply 116 may also supply power to the DUT 104 (connections not shown).

The test device 102 may include one or more tester modules 120. A tester module 120a may couple the controller 112 to the DUT 104 through a connection 122 with the interface 106. The tester module 120a may provide a general or a specialized function. For example, one tester module 120a may determine the capacitance of a capacitor. Another tester module 120b may functionally test digital components on the DUT 104. Another tester module may test analog components. Another tester module may test for continuity of particular nets. The tester module 120a may be one of a plurality of tester modules 120 that the controller 112 can selectably couple to the DUT 104. The tester module 120a may be a separately removable module from the test device 102, it may be a module that is integrated in a particular interface 106 or it may be a standalone tester. The tester module 120a may be capable of running a series of different tests, or the tester module 120a may only execute a single test.

The tester module 120a may electrically isolate the DUT 104 from the test device 102. Electrical isolation may include isolation of a power supply in the test device 102 from a power supply for the DUT 104, and electrical isolation may include isolation of the signals that couple the test device 102 to the DUT 104. Electrical isolation may protect sensitive circuitry in the test device 102 or in the DUT 104 from damage. For example, a tester module 120a may isolate the test device 102 from the DUT 104 to protect low-voltage components in the test device 102 from stray high-voltage on a defective DUT 104.

To isolate signals that couple the test device 102 to the DUT 104, the tester module 120a may include electromechanical relays, solid state relays, field-effect transistors (FETs), optical isolation—such as opto-isolators or infrared transceivers—radio frequency communication, or other communication methods.

To isolate a power supply for the DUT 104 from the power supply of the test device 102, the tester module may include a second power supply 124. The second power supply 124 may provide power derived from, but isolated from the first power supply 116. For example, the second power supply 124 may comprise a transformer or a DC—DC converter. FIG. 1 shows an isolated second power supply 124 that provides an isolated voltage reference 126 and an isolated voltage supply 128, according to one implementation. The second power supply 124 could be included in the tester module 120a, in the test device 102, in the interface 106, or anywhere else where it would function to electrically isolate the test device 102 from the DUT 104. As shown in FIG. 1, the second power supply 124 may supply power to the DUT 104 through a connection 130 with the interface 106. The second power supply 124 may also supply power to a part of the tester module 120a in some implementations.

In addition to protecting sensitive circuitry, isolation of the second power supply 124 from the first power supply 116 may facilitate testing of a DUT 104 that has dual-polarity (positive $V_{CC}$ and negative $V_{EE}$ supplies, for example) with a single-polarity second power supply 124. For example, consider the following method to test capacitors for decoupling a dual-polarity power supply. To test a capacitor 140 by applying a voltage to it, wherein the capacitor 140 bridges the DUT's $V_{CC}$ 134 and GND 138 on the DUT 104, the isolated ground 126 may be coupled to GND 138, and the isolated voltage 128 may be coupled to $V_{CC}$ 134. On the other hand, to test a capacitor 142 that bridges GND 138 and $V_{EE}$ 136, the isolated ground 126 may be coupled to $V_{EE}$ 136, and the isolated voltage supply 128 may be coupled to GND 138. In this manner, GND 138 is maintained at a higher potential than $V_{EE}$ 136, $V_{CC}$ 134 is maintained at a higher potential than GND 138, and no devices are reverse-biased by the test device 102.

Figure 2A:
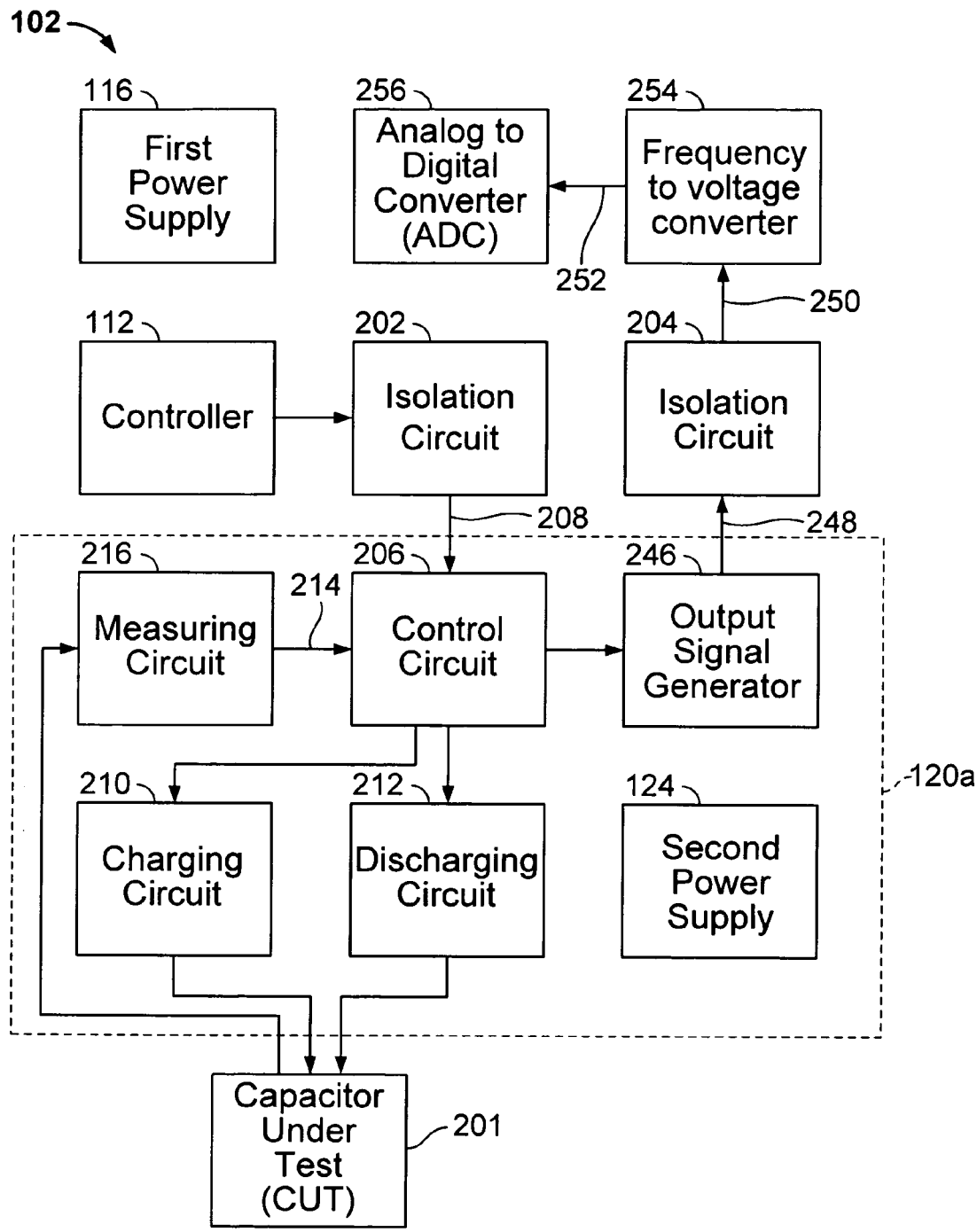
FIG. 2A is a block diagram showing additional details of the test circuit module shown in FIG. 1, according to one implementation.

FIG. 2A is a block diagram showing additional details of the test device 102 shown in FIG. 1, according to one implementation. Here, the controller 112 controls the operation of the test circuit module 120a to measure capacitance of a capacitor under test (CUT) 201. The CUT 201 may be a component on the DUT 104 that is shown in FIG. 1. For example, the CUT 201 may be the capacitor 140 or the capacitor 142. The test circuit module 120a may be isolated from the rest of the test device 102 by a second power supply 124, an isolation circuit 202 for inputs to the tester module 120a and by an isolation circuit 204 for outputs of the tester module 120a.

According to one implementation, the controller 112 sends commands 208 to a control circuit 206 to alternately charge and discharge the CUT 201. In this implementation, the control circuit 106 alternately charges and discharges the CUT 201 by alternately coupling a charging circuit 210 and a discharging circuit 212 to the CUT 201. The commands 208 may be electrically isolated from the controller 112 by the isolation circuit 202. The controller 112 may initially cause the control circuit 206 to couple the discharging circuit 212 to the CUT 201 to initially discharge it. The control circuit 206 may also receive feedback 214 from a measuring circuit 216 that measures voltage (shown in FIG. 2B) across the CUT 201. Based on the feedback 214, the control circuit 206 may couple either the charging circuit 210 or the discharging circuit 212 to the CUT 201.

Figure 2B:
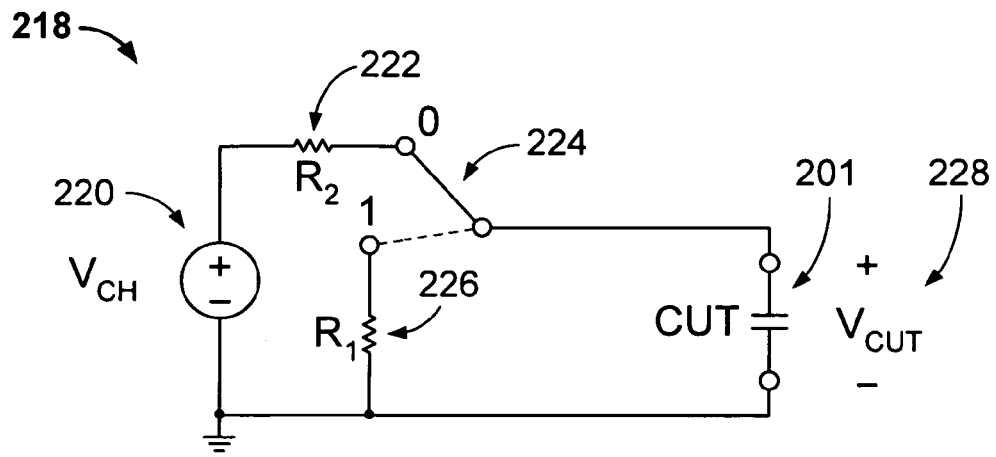
FIG. 2B is a functional schematic of the charging circuit and discharging circuit shown in FIG. 2A, according to one implementation.

FIG. 2B shows a functional schematic 218 of the charging circuit 210 and the discharging circuit 212, shown in FIG. 2A, according to one implementation. The charging circuit 210 comprises a charging voltage 220, a charging resistor 222, and a switch 224 that can couple the charging voltage 220 to the CUT 201 when the switch 224 is in position '0.' The discharging circuit 212 comprises the switch 224 and a discharging resistor 226 that can be coupled across the CUT 201 when the switch 224 is in position '1.' The switch 224 may be controlled by the control circuit 206 shown in FIG. 2A.

When the charging voltage 220 is coupled to the CUT 201, a voltage 228 develops across the CUT 201 as the CUT 201 charges. (Hereafter, the voltage 228 across the CUT 201 is referred to as "$V_{CUT}$ 228.") $V_{CUT}$ 228 increases until it reaches the level of the charging voltage 220 or until the switch 224 moves from position '0' to position '1.' When the discharging resistor 226 is coupled to the CUT 201, the CUT 201 discharges and $V_{CUT}$ 228 decreases until it reaches a zero potential relative to the charging voltage 220 or until the switch 224 moves from position '1' to position '0.'

Figure 2C:
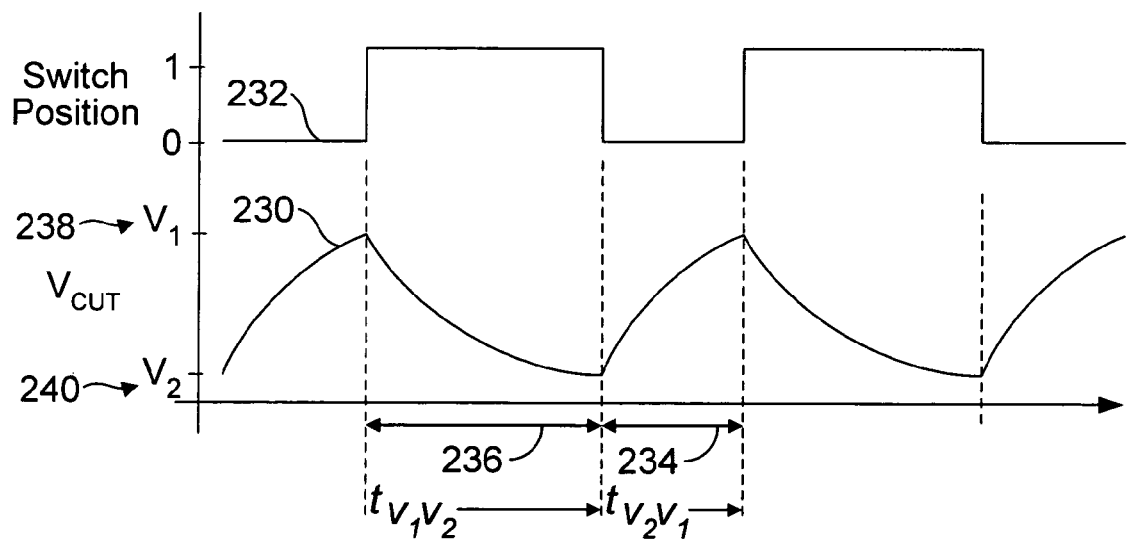
FIG. 2C is a waveform diagram showing additional details of the test circuit module shown in FIG. 2A, according to one implementation.

FIG. 2C shows a waveform 230 of $V_{CUT}$ 228 as a function of time, as the CUT 201 charges and discharges. Waveform 232 represents the corresponding position of the switch 224 as a function of time. The control circuit 206 may alternate between coupling the charging voltage 220 to the CUT 201 during a charging phase 234 and coupling the discharging resistor 226 to the CUT 201 during a discharging phase 236. The control circuit 206 may alternate between phases based on feedback 214 from the measuring circuit 216 representing the $V_{CUT}$ 228. For example, the control circuit 206 may couple the charging voltage 220 to the CUT 201 until $V_{CUT}$ 228 reaches a first voltage 238. When $V_{CUT}$ 228 reaches the first voltage 238, the control circuit 206 may couple the discharging resistor 226 to the DUT 104 until $V_{CUT}$ 228 reaches a second voltage 240, at which point the controller 112 may again couple the charging voltage 220 to the CUT 201. There may be an initial discharge phase (not shown), during which switch 224 is in the '1' position to initially discharge ("reset") the CUT 201. After an initial discharge phase, time needed charge the CUT 201 from the second voltage 240 to the first voltage 238 is represented by $t_{V2V1}$; time needed discharge the CUT 201 from the first voltage 238 to the second voltage 240 is represented by $t_{V1V2}$.

In one implementation, an output signal generator 246, shown in FIG. 2A, generates a periodic signal 248 having a frequency that is related to the capacitance of the CUT 201. The frequency may be based on a rate at which the control circuit 206 alternates between the charging phase 234 and the discharging phase 236, in one implementation. The test device 102 may include a capacitance-determining block (not shown) that determines capacitance from the frequency of the periodic signal 248. The periodic signal 248 may be electrically isolated from the test device 102 by the isolation circuit 204. In one implementation, an isolated periodic signal 250 is converted to a voltage representation 252 by a frequency-to-voltage converter 254. The voltage representation 252 may be subsequently converted to a digital value (not shown) by an analog-to-digital converter (ADC) 256. The digital value may be subsequently processed by circuitry, by software executed on a computer device, or by a combination of circuitry and software executed on a computer device. For example, an in-circuit tester may include a computer device that executes software that determines the capacitance value of the CUT 201 from a digital value output by the ADC 256. The controller 112 may comprise the computer device.

The controller 112 determines the capacitance of the CUT 201, according to one implementation, from the frequency of the periodic signal 248, as explained below.

The frequency, f, of the periodic signal 248 is inversely related to a period, T, of the periodic signal 248.

Eqn. 1:

$$f = \frac{1}{T}$$

Figure 2D:
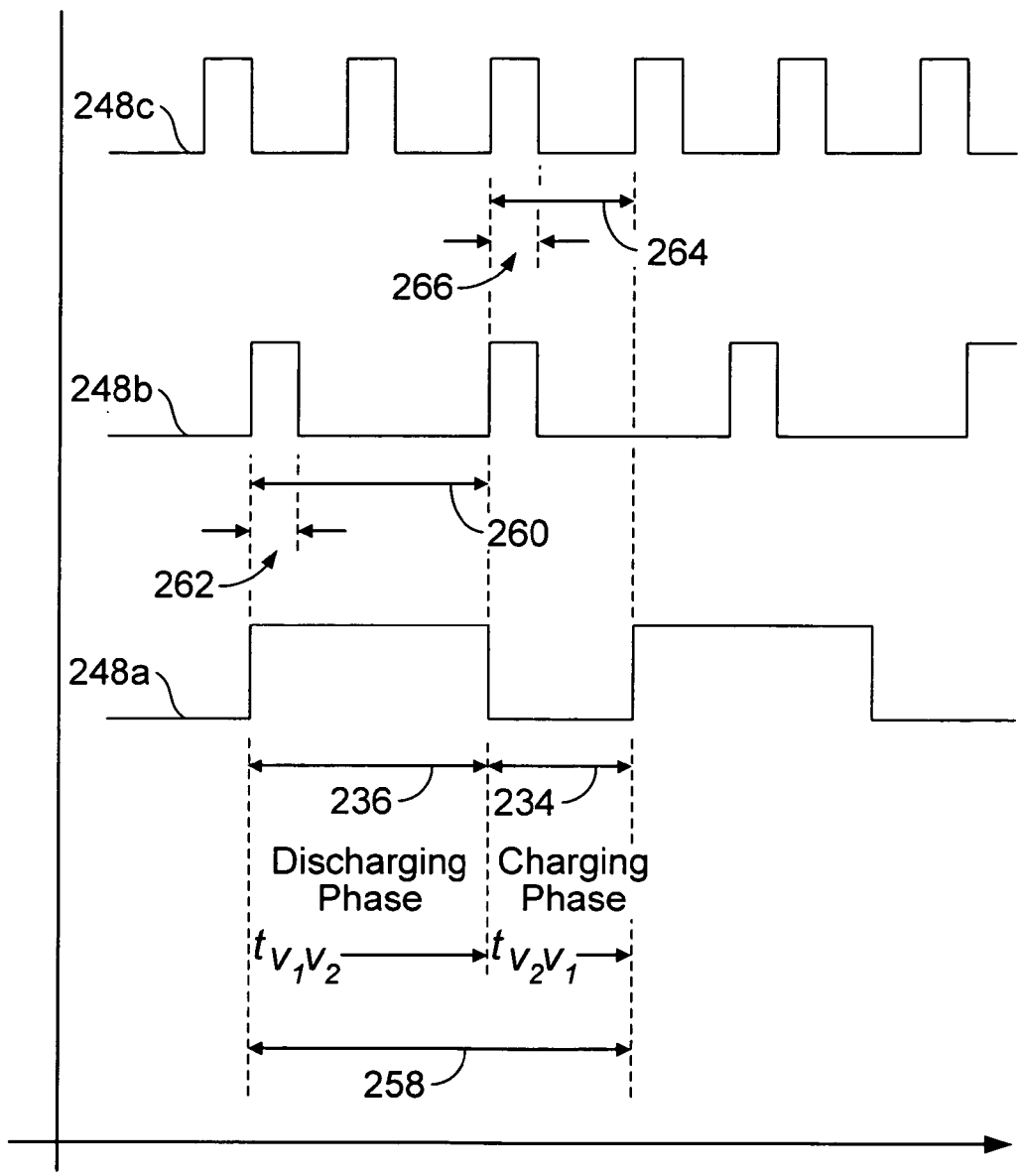
FIG. 2D is a waveform diagram showing periodic signals that could be generated by the output signal generator that is shown in FIG. 2A, according to one implementation.

In certain implementations, the period is related to $t_{V1V2}$, $t_{V2V1}$ or the combination of the two values. Periodic signals for three different implementations are shown in FIG. 2D. In one implementation, a periodic signal 248a has a period 258 that is equal to $t_{V1V2}$ plus $t_{V2V1}$. In another implementation, a periodic signal 248b has a period 260 that is equal to $t_{V1V2}$. The periodic signal 248b may have one phase having a predetermined, fixed length 262 that is less than the period 260. The periodic signal 248b may be generated, for example, by a tunable oscillator (not shown) and a phase-lock loop (PLL) (not shown). In another implementation, a periodic signal 248c has a period 264 that is equal to $t_{V2V1}$. The periodic signal 248c may have one phase having a predetermined, fixed length 266 that is less than the period 264.

The relationship between the frequency of a periodic signal 248 and capacitance of the CUT 201 is further explained with reference to FIG. 2B, FIG. 2C, FIG. 2D and the equations below.

During the discharging phase 236, $V_{CUT}$ 228 satisfies the following equation:

Eqn. 2:

$$V_2 = V_1 e^{\frac{-t_{V1V2}}{\tau_{discharging}}}$$

When the DUT 104 is discharged through the discharging resistor 226, $\tau_{discharging}$ is equal to $R_1C$, where C is the capacitance to be measured (the capacitance of the CUT 201), and $R_1$ is the resistance of the discharging resistor 226.

During the charging phase 234, $V_{CUT}$ 228 satisfies the following equation:

Eqn. 3:

$$V_1 - V_2 = V_{CH}\left(1 - e^{\frac{-t_{V2V1}}{\tau_{charging}}}\right)$$

When the CUT 201 is charged through the charging resistor 222, $\tau_{charging}$ is equal to $R_2C$, where C is the capacitance to be measured (the capacitance of the CUT 201) and $R_2$ is the resistance of the discharging resistor 226.

Substituting for $\tau_{discharging}$ and $\tau_{charging}$ in Eqn. 2 and Eqn. 3, and solving for $t_{V1V2}$ and $t_{V2V1}$, respectively, yields the following:

Eqn. 4:

$$t_{V1V2} = -R_1 C \ln\left(\frac{V_2}{V_1}\right)$$

Eqn. 5:

$$t_{V2V1} = -R_2 C \ln\left(\frac{V_{CH} - V_1 + V_2}{V_{CH}}\right)$$

Eqn. 4 or Eqn. 5 can now be substituted for T in Eqn. 1, depending on the nature of the periodic signal 248 generated. For example, the output signal 248b has the period 260, equal to $t_{V1V2}$. Thus, substituting Eqn. 4 for T in Eqn. 1 yields the following relationship between the frequency of the output signal 248b and the capacitance of the CUT 201:

Eqn. 6:

$$f = \frac{1}{-R_2 C \ln\left(\frac{V_{CH} - V_1 + V_2}{V_{CH}}\right)}$$

Solving Eqn. 6 for C yields:

Eqn. 7:

$$C = \frac{1}{-R_2 f \ln\left(\frac{V_{CH} - V_1 + V_2}{V_{CH}}\right)}$$

Similarly, for the output signal 248c whose period 264 is equal to $t_{V2V1}$ the capacitance and frequency are related by:

Eqn. 8:

$$C = \frac{1}{-f\, R_1 \ln\left(\frac{V_2}{V_1}\right)}$$

For the output signal 248a, whose period 258 is equal to $t_{V1V2}$ plus $t_{V2V1}$, the capacitance and frequency are related by:

Eqn. 9:

$$C = \frac{1}{-f\left(R_1 \ln\left(\frac{V_2}{V_1}\right) + R_2 \ln\left(\frac{V_{CH} - V_1 + V_2}{V_{CH}}\right)\right)}$$

Figure 3A:
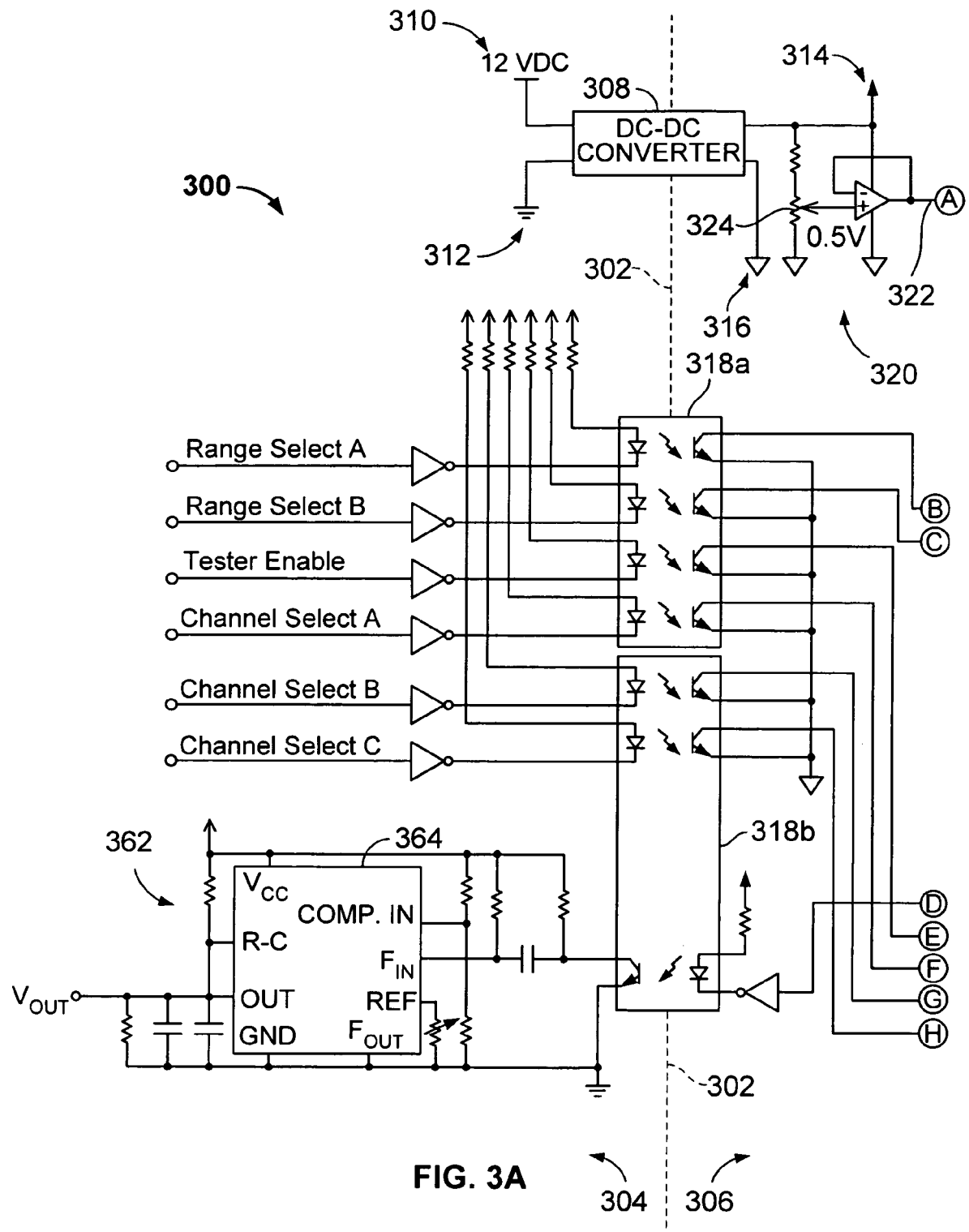
FIG. 3A and FIG. 3B, together, are a schematic diagram of one implementation of the test device shown in FIG. 1.
Figure 3B:
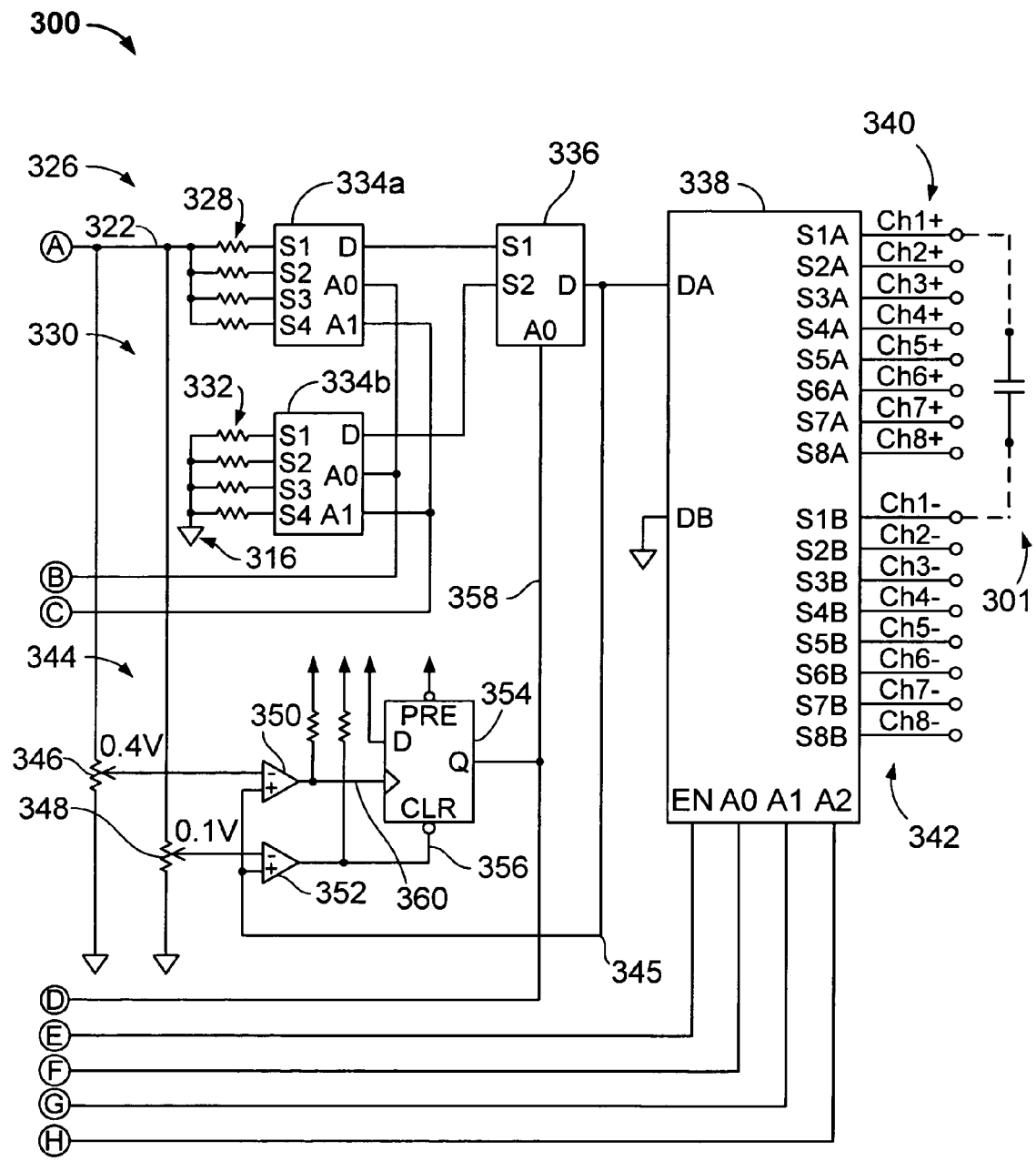

FIG. 3A and FIG. 3B show a schematic diagram of an exemplary implementation 300 of the test device 102 that is shown in FIG. 1. In FIG. 3B, a capacitor under test (CUT) 301 is shown coupled to the exemplary implementation 300. The CUT 301 may be a component on the DUT 104 that is shown in FIG. 1. For example, the CUT 301 may be the capacitor 140 or the capacitor 142.

In the exemplary implementation 300, an isolation barrier 302 separates a first circuit 304 from a second circuit 306 The isolation barrier 302 isolates voltages and signals. A DC—DC converter 308, such as a Traco Electronics TEM2-1211 device, isolates voltages from the first circuit 304 from voltages in the second circuit 306. As shown in the exemplary implementation 300, the DC—DC converter 308 takes as input a supply voltage 310 and a ground reference 312 associated with the first circuit 304. The DC—DC converter 308 outputs an isolated supply voltage 314 and an isolated ground reference 316. Opto-isolator components 318a and 318b isolate signals associated with the first circuit 304 from those associated with the second circuit 306. In the exemplary implementation 300, the opto-isolators 318a and 318b are ISOCOM TIL 193 components.

From the isolated supply voltage 314, a charging voltage circuit 320 establishes a charging voltage 322. The charging voltage circuit 320 may be, for example, a voltage follower circuit comprising a National Semiconductor LM324 operational amplifier. The charging voltage 322 may be adjustable. For example, in the exemplary implementation 300, the voltage is adjustable by a potentiometer 324. Optionally, the charging voltage 322 may be selected to minimize leakage current drawn by devices that are electrically coupled to the CUT 301 (example shown in FIG. 3C). Minimizing leakage current may involve selecting the charging voltage 322 such that components that are operatively coupled to the CUT 301 are not turned on. For example, when a semiconductor junction is operatively coupled to the CUT 301, the charging voltage 322 should be selected such that it is lower than a threshold bias voltage of the semiconductor junction. In the exemplary implementation 300, the charging voltage circuit 320 provides a charging voltage 322 of 0.5 V. One skilled in the art will appreciate that a charging voltage 322 much lower than 0.5 V may be selected.

Referring to FIG. 3B, the charging voltage 322 powers a charging circuit 326, according to the exemplary implementation 300. The charging circuit 326 comprises a plurality of charging resistors 328 that can be selectively coupled to the CUT 301. Also coupleable to the CUT 301 is a discharging circuit 330. The discharging circuit 330 includes a plurality of discharging resistors 332 that can selectively couple the isolated ground 316 to the CUT 301.

In a charging mode, a series of analog multiplexers 334a, 336 and 338 couple the charging voltage 322, through one resistor of the plurality of charging resistors 328, to the CUT 301. In a discharging mode, a series of analog multiplexers 334b, 336 and 338 couple the isolated ground 316, through one resistor of the plurality of discharging resistors 332, to the CUT 301. An analog multiplexer 334a, such as an Analog Devices ADG407, selects a particular charging resistor from the plurality of charging resistors 328. A similar analog multiplexer 334b selects a particular discharging resistor from the plurality of charging resistors 332. In the exemplary implementation 300, the analog multiplexers 334a and 334b are included in the same component package. A particular charging resistor and a particular discharging resistor are selected based upon the state of the control signals "Range Select A" and "Range Select B" shown in FIG. 3A. Range Select A and Range Select B are isolated by the opto-isolator 318a, and corresponding isolated control signals appear on net 'B' and net 'C,' respectively. Another analog multiplexer 336, such as an Analog Devices ADG719, selects between coupling the charging circuit 326 to the CUT 301 or coupling the discharging circuit 330 to the CUT 301.

Figure 3C:
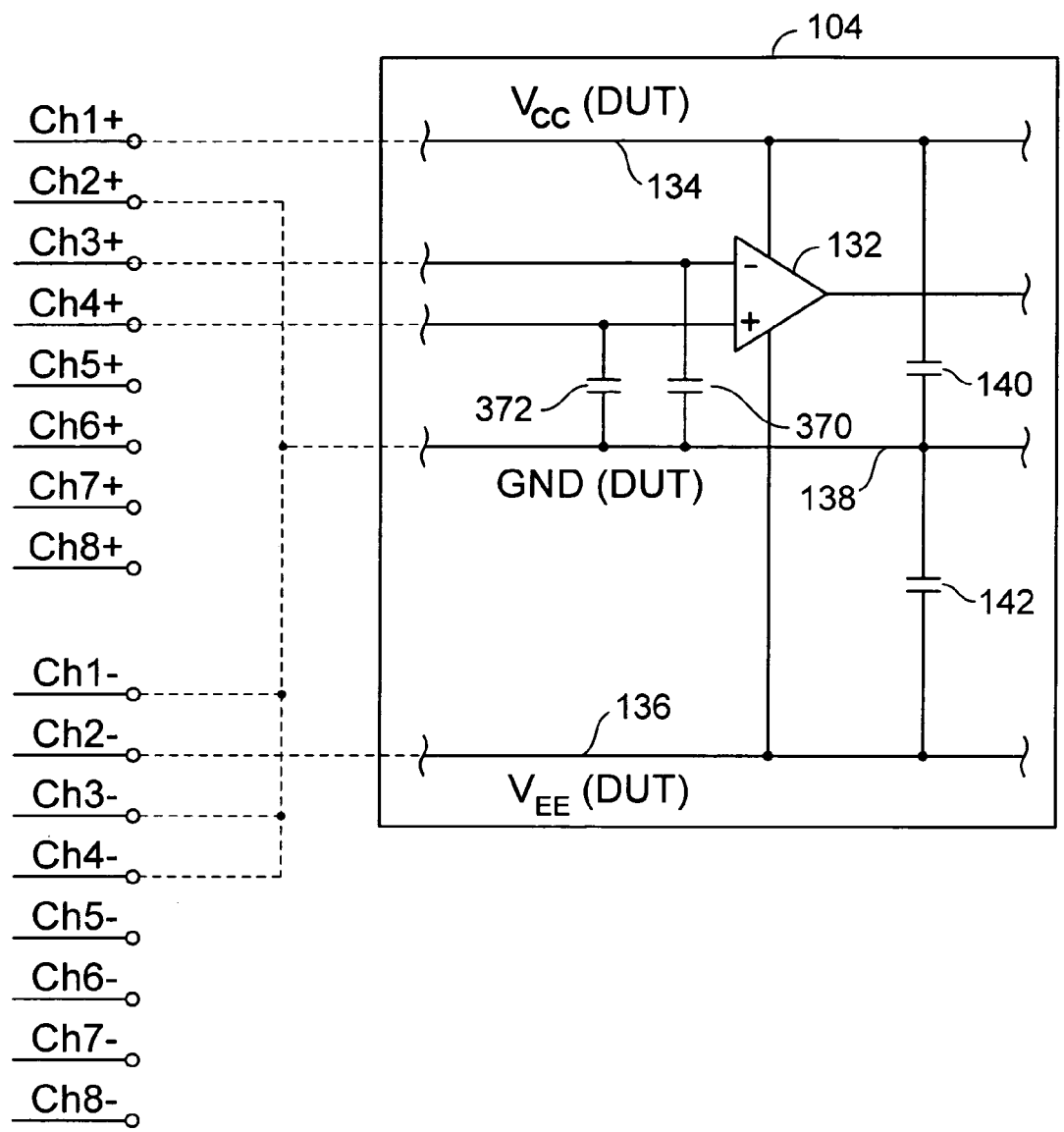
FIG. 3C is a schematic diagram of one implementation of a device under test (DUT) connected to the test device shown in FIG. 3A and FIG. 3B.

In the exemplary implementation 300, another analog multiplexer 338, such as an Analog Devices ADG407, creates a plurality of "channels" to which a plurality of components to be tested can be connected. As shown in the exemplary implementation 300, the multiplexer 338 comprises eight channels, each channel comprising a first connection selected from a first group 340 of connections, and a second connection selected from a second group 342 of connections. A specific channel is selected by the control signals "Channel Select A," "Channel Select B," and "Channel Select C" shown in FIG. 3A. Isolated versions of these three control signals appear on nets 'F,' 'G,' and 'H,' respectively. The two connections in each channel allow a channel to test a separate component. As shown in FIG. 3B, a single CUT 301 is connected to channel 1—one terminal to the first connection ("Ch1+") and the other terminal to the second connection ("Ch−"). When the analog multiplexer 338 is enabled with a "Tester Enable" control signal (shown in FIG. 3A)—an isolated version of which appears on net 'E'—the isolated ground is coupled to the second connection of the selected channel and either the charging circuit 326 or discharging circuit 330 is coupled to the first connection of the selected channel. FIG. 3C provides an example of how a plurality of different channels may be used to test different components on a device under test.

A measurement and control circuit (MCC) 344 alternately couples the charging circuit 326 to the CUT 301 or couples the discharging circuit 330 to the CUT 301, based on the voltage 345 across the CUT 301 (relative to the isolated ground 316). In one implementation, the measuring portion of the MCC 344 detects when the voltage 345 is above a first threshold or is below or substantially equals (is within about 1 mV, according to one implementation) a second threshold. In the exemplary implementation 300, the first threshold is set with a first potentiometer 346, and the second threshold is set with a second potentiometer 348. As shown in the exemplary implementation 300, the first and second thresholds are 0.4V and 0.1, respectively.

The control portion of the MCC 344 keeps the voltage mostly between the first and second thresholds by alternately coupling either the charging circuit 326 or the discharging circuit 330 to the CUT 301. In a charging mode, the MCC 344 couples the charging circuit 326 to the CUT 301 until the voltage 345 exceeds the first threshold. When the voltage 345 exceeds the first threshold, the MCC 344 couples the discharging circuit 330 to the CUT 301 until the voltage 345 substantially equals or drops below the second threshold. When the voltage 345 substantially equals or drops below the second threshold, the MCC 344 again couples the charging circuit 326 to the CUT 301.

To detect whether the voltage 345 is above the first voltage threshold or is below or substantially equals the second voltage threshold, the exemplary implementation 300 uses a pair of comparators 350 and 352, such as National Semiconductor LM339 components.

To control whether the charging circuit 326 or the discharging circuit 330 is coupled to the DUT 104, the exemplary implementation 300 uses a flip-flop 354, such as a Texas Instruments 74LS74, and the analog multiplexer 336. In the exemplary implementation 300, when the voltage 345 drops below or substantially equals the second voltage threshold, the output 356 of the comparator 352 goes to a logic low state, which clears the flip-flop 354. When the flip-flop 354 is cleared, its output 358 is in a logic low state, which selects "S1" of the analog multiplexer 336, thereby coupling the charging circuit 326 to the CUT 301. As long as the voltage 345 is below the first threshold, the output 360 of the comparator 350 is low. When the voltage 345 rises above the first threshold, the output 360 goes to a logic high, which clocks the flip-flop 354. Since the 'D' input of the flip-flop 354 is tied to a logic high, clocking the flip-flop 354 causes the output 358 to go to a logic high, which switches the analog multiplexer 336 from "S1" to "S2," thereby coupling the discharging circuit 330 to the CUT 301. In this manner, the MCC 344 maintains the voltage 345 substantially between the first voltage threshold and the second voltage threshold.

In the exemplary implementation 300, a periodic signal (net 'D') is generated by the flip-flop 354. The period of the periodic signal (net 'D') is equal to the time needed to charge the CUT 301 from the second threshold to the first threshold plus the time needed to discharge the CUT 301 from the first threshold to the second threshold. In the exemplary implementation 300, the periodic signal (net 'D') is routed to a frequency-to-voltage conversion circuit 362 (shown in FIG. 3A), which may comprise a frequency-to-voltage converter 364 such as an Analog Devices LM331. The frequency-to-voltage conversion circuit 362 outputs a representative voltage signal, $V_{OUT}$, that represents the frequency of the periodic signal, net 'D.' The $V_{OUT}$ signal can be further processed by the test device 102. For example, referring to FIG. 1, the controller 112 may determine capacitance of the CUT 301 from $V_{OUT}$ and compare the determined capacitance to an expected capacitance to ascertain whether the capacitance is within specification. To determine the capacitance of the CUT 301, the controller 112 may use a separate capacitance-determining block (not shown). Alternatively, the controller 112 may include an integrated capacitance-determining block. In one implementation, the capacitance-determining block may convert $V_{OUT}$ to a digital value, and the controller may execute software to further process the digital value. In another implementation, the capacitance-determining block may include analog circuitry that compares $V_{OUT}$ to at least one voltage that corresponds to an expected or known capacitances.

FIG. 3C is a schematic diagram that illustrates how four different channels can test four different components on a DUT, like the DUT 104 shown in FIG. 1, according to one implementation.

Referring to both FIGS. 3B and 3C, a first channel can be used to test a capacitor 140 in the exemplary implementation. The first connection of the first channel ("Ch1+") connects to the more positive terminal of the capacitor 140 ($V_{CC}$ 134), which bridges the $V_{CC}$ 134 and GND 138 voltage rails of the DUT 104. The second connection of the first channel ("Ch1−") connects to the more negative terminal of the same capacitor 140 (GND 138). When the tester is enabled and the first channel is selected, the isolated ground 316 (shown in FIG. 3A and FIG. 3B) is coupled to GND 138. During a charging mode, the charging circuit 326 is coupled to $V_{CC}$ 134. During a discharging mode, the discharging circuit 330 is coupled to $V_{CC}$ 134.

A second channel can be used to test a different capacitor 142. Note that the capacitor 142 bridges the $V_{EE}$ 136 and GND 138 voltage rails of the DUT 104. If the isolated ground 316 were connected to GND 138, application of the charging voltage 322 to $V_{EE}$ 136 would reverse-bias components connected to $V_{EE}$ 136. To prevent a reverse-bias on the DUT 104 components, the first connection of the second channel ("Ch2+") connects to GND 138—the more positive end of GND-$V_{EE}$ circuits; the second connection of the second channel ("Ch2−") couples the isolated ground 316 to $V_{EE}$ 136.

Other channels can be used to test other components. For example, a third channel can be used to test a third capacitor 370, and a fourth channel can be used to test a fourth capacitor 372.

Figure 4:
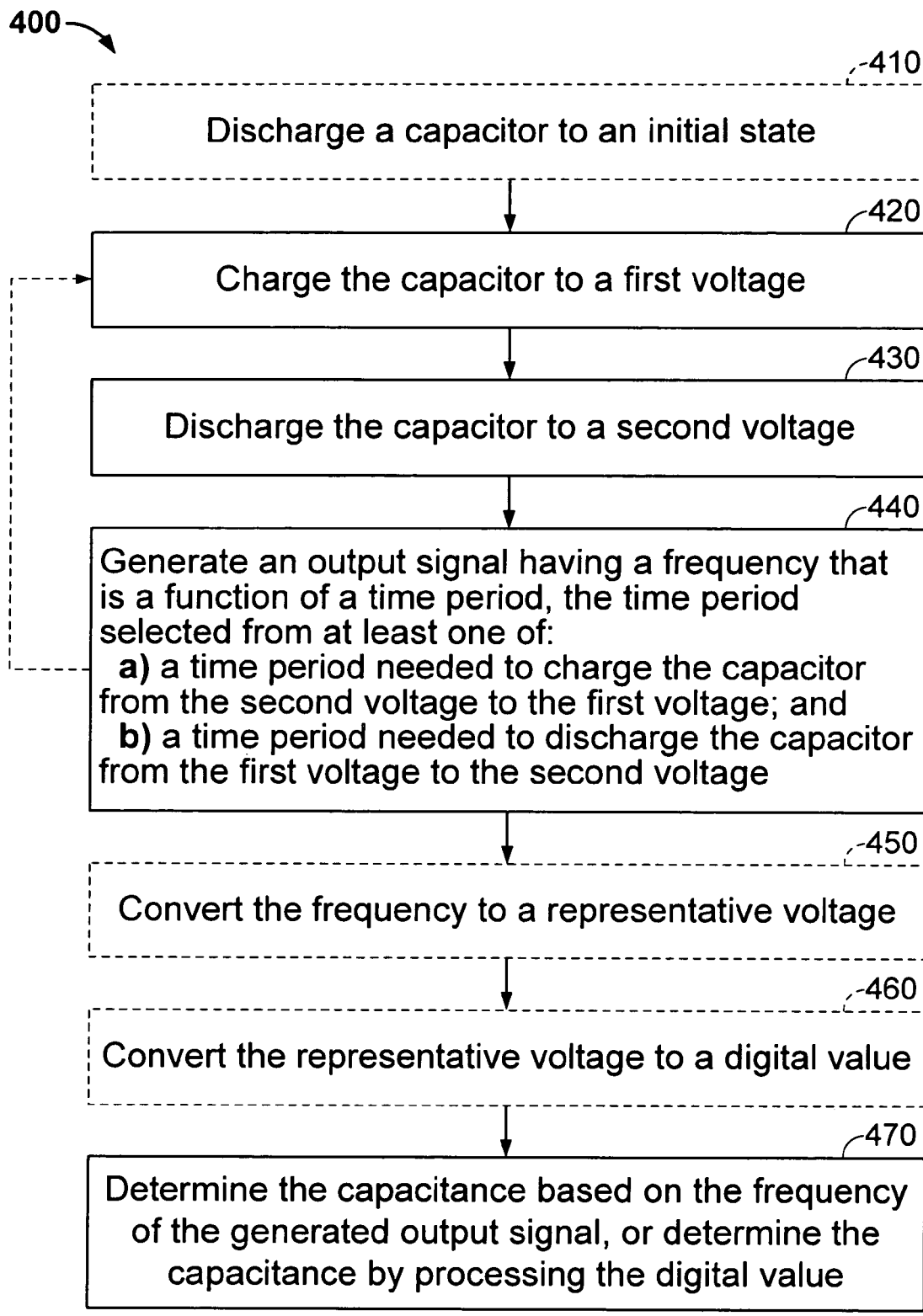
FIG. 4 is a flow chart of a method for determining the capacitance of a capacitor, according to one implementation.

FIG. 4 is a flow chart of a method 400 for determining the capacitance of a capacitor, according to one implementation. The method may be performed, for example, by the test device 102 to determine the capacitance of the CUT 201 shown in FIG. 2B. The method comprises the actions described below.

In an optional action 410, a capacitor is discharged to an initial state. For example, the controller 112 may cause the discharging resistor 226 to be coupled to the CUT 201 to discharge the CUT 201 to an initial state.

In an action 420, the capacitor is charged to a first voltage. For example, the controller 112 may cause the charging voltage 220 to be coupled to the CUT 201 during the charging phase 234, until $V_{CUT}$ 228 reaches the first voltage 238. The CUT 201 may be charged through a first impedance. For example, the charging voltage 220 may be coupled to the CUT 201 through the charging resistor 222.

In an action 430, the capacitor is discharged to a second voltage. The capacitor may be discharged through a second impedance. For example, the controller 112 may cause the discharging resistor 226 to be coupled to the CUT 201 during the discharging phase 236, until $V_{CUT}$ 228 reaches the second voltage 240.

In an action 440, an output signal is generated having a frequency that is a function of a time period, the time period selected from at least one of:
  a) a time period needed to charge the capacitor from the second voltage to the first voltage; and
  b) a time period needed to discharge the capacitor from the first voltage to the second voltage.

For example, in one implementation, the output signal generator 246 (shown in FIG. 2A) may generate an output signal 248c (shown in FIG. 2D) that has a frequency that is defined by the time period 264, wherein the time period 264 is equal to the time $t_{V2V1}$ needed to charge the CUT 201 from the second voltage 240 to the first voltage 238. In another implementation, the output signal generator 246 may generate an output signal 248b that has a frequency that is defined by the time period 260, wherein the time period 260 is equal to the time $t_{V1V2}$ needed to discharge the CUT 201 from the first voltage 238 to the second voltage 240. In another implementation, the output signal generator 246 may generate an output signal 248a that has a frequency that is defined by the time period 258, wherein the time period 258 is equal to the time $t_{V1V2}$ plus the time $t_{V2V1}$.

Actions 420, 430 and 440 may optionally be repeated a predetermined number of times. For example, the controller 112 may cause the charging circuit 210 and the discharging current 212 to be alternately coupled to the CUT 201 a predetermined number of times. The controller may subsequently determine an average $t_{V1V2}$ or $t_{V2V1}$. The output signal generator 246 may then generate an output signal 243 based on the average $t_{V1V2}$ or based on the average $t_{V2V1}$.

In an optional action 450, the frequency of the output signal is converted to a representative voltage. For example, the frequency of the output signal 248 may be converted to a representative voltage 252 (shown in FIG. 2A) by the frequency-to-voltage converter 254. The representative voltage may be isolated from the charging voltage 220. For example, the representative voltage 252 may be isolated from the charging voltage 220 by the isolation circuit 204 and/or by the frequency-to-voltage converter 254.

In an optional action 460, the representative voltage is converted to a digital value. For example, the representative voltage 252 may be converted to a digital value by the analog-to-digital converter (ADC) 256.

In an action 470, the capacitance value is determined based on the frequency of the generated output signal, or the capacitance value is determined by processing the digital value. For example, in one implementation, the capacitance may be determined based on the frequency of the output signal 248 according to Eqn. 7, 8 or 9. In another implementation, the capacitance may be determined by processing the digital value produced by the ADC 256. Once the capacitance value is determined, it may be subsequently processed. Subsequent processing may include, for example, displaying the value in the human interface 114 (shown in FIG. 1), comparing the value to one or more other expected values to verify that the value is within an appropriate range, or performing some other action.

Figure 5:
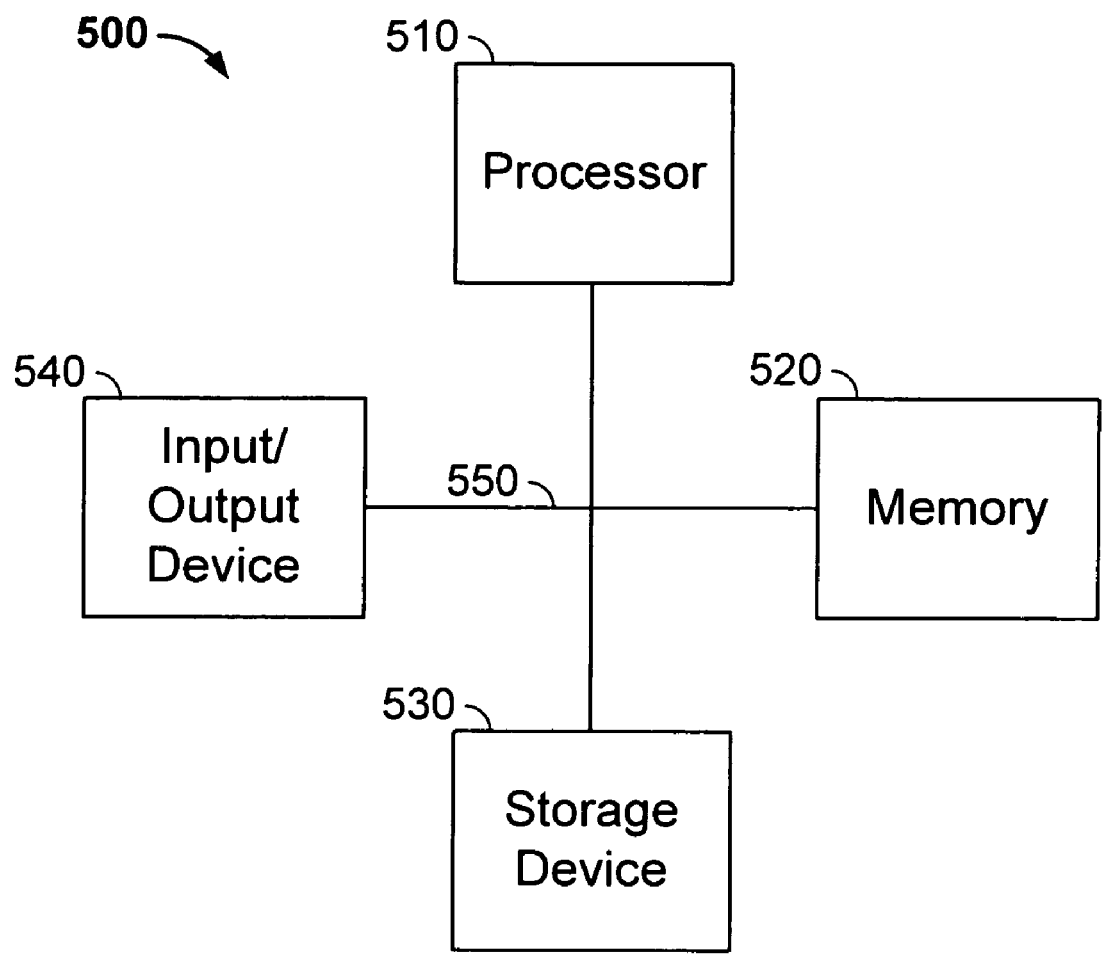
FIG. 5 is a block diagram of an exemplary computer device.

FIG. 5 is a block diagram of a computer system 500 that can be used in the operations described above, according to one implementation. For example, the controller 112 may include the computer system 500. The computer system 500 includes a processor 510, a memory 520, a storage device 530 and an input/output device 540. Each of the components 510, 520, 530 and 540 are interconnected using a system bus 550.

The processor 510 is capable of processing instructions for execution within the computer system 500. In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the computer system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the computer system 500. In one implementation, the storage device 530 is a computer-readable medium. In various different implementations, the storage device 530 may be a floppy disk device, a hard disk device, an optical disk device, or a tape device.

The input/output device 540 provides input/output operations for the computer system 500. In one implementation, the input/output device 540 includes a keyboard and/or pointing device. In one implementation, the input/output device 540 includes the communication interface 114 as discussed above with reference to FIG. 1.

The computer system 500 may include a back-end component, such as a data server or a middleware component, such as an application server or an Internet server, or a front-end component, such as a client computer having a graphical user interface or an Internet browser, or any combination of them. The components of the computer system 500 can be connected by any form or medium of digital data communication such as a communication network. Examples of communication networks include, e.g., a LAN, a WAN, and the computers and networks forming the Internet.

The computer system 500 can include clients and servers. A client and server are generally remote from each other and typically interact through a network, such as the described one. The relationship of client and server arises by virtue of computer programs running on the respective computers and having a client-server relationship to each other.

A number of implementations have been described. Nevertheless, it will be understood that various modifications may be made without departing from the spirit and scope of this disclosure. Accordingly, other implementations are within the scope of the following claims.

What is claimed is:

1. A method for determining capacitance of a capacitor, the method comprising:
   alternately charging a capacitor to a first voltage and discharging the capacitor to a second voltage, wherein charging the capacitor to the first voltage comprises applying a charging voltage to the capacitor;
   generating an output signal having a frequency that is a function of a time period, the time period selected from the group consisting of:
      a) a time period needed to charge the capacitor from the second voltage to the first voltage; and
      b) a time period needed to discharge the capacitor from the first voltage to the second voltage;
   determining the capacitance based on the frequency of the output signal; and
   selecting the first voltage, the second voltage, and the charging voltage such that when at least one of the first voltage, the second voltage, and the charging voltage is applied to the capacitor, a semiconductor component operatively coupled to the capacitor is not turned on.

2. The method of claim 1, wherein charging the capacitor to the first voltage comprises charging the capacitor through a first impedance.

3. The method of claim 1, wherein discharging the capacitor to the second voltage comprises discharging the capacitor through a second impedance.

4. The method of claim 1, wherein alternately charging and discharging the capacitor is repeated a predetermined number of times.

5. The method of claim 1, wherein the output signal is digital.

6. The method of claim 1, further comprising discharging the capacitor to an initial state before alternately charging and discharging the capacitor.

7. The method of claim 1, wherein determining the capacitance based on the frequency of the output signal further comprises:
   converting the frequency to a representative voltage;
   converting the representative voltage to a digital value; and
   processing the digital value to determine the capacitance.

8. The method of claim 7, wherein the representative voltage is electrically isolated from the capacitor.

9. An in-circuit tester for determining capacitance of a capacitor, the in-circuit tester comprising:
   a charging circuit comprising a voltage source, the charging circuit being selectably coupleable to a capacitor, such that when the charging circuit is coupled to the capacitor, the capacitor is charged by the voltage source until voltage across the capacitor is substantially equal to a first voltage value;
   a discharging circuit comprising a discharging impedance having a first value, the discharging impedance being selectably coupleable to the capacitor, such that when the discharging circuit is coupled to the capacitor, the capacitor is discharged through the discharging impedance until the voltage across the capacitor is substantially equal to a second voltage value;

a control circuit that determines, based on the voltage across the capacitor,
whether:
  a) to couple the charging circuit to the capacitor;
  b) to couple the discharging circuit to the capacitor; or
  c) to couple neither the charging circuit to the capacitor, nor to couple the discharging circuit to the capacitor;
an output signal-generating circuit that generates an output signal having a frequency that is a function of the capacitance of the capacitor; and
a capacitance-determining block that determines the capacitance based on the frequency of the output signal; and
a first power supply and a second power supply, the second power supply being electrically isolated from the first power supply, wherein the first power supply supplies power to at least the capacitance-determining block and wherein the second power supply supplies power to at least the charging circuit.

10. The in-circuit tester of claim 9, wherein the control circuit performs actions comprising:
  a) coupling the charging circuit to the capacitor when the voltage across the capacitor is less than or substantially equal to the second voltage value; then
  b) coupling the discharging circuit to the capacitor when the voltage across the capacitor is greater than the first voltage value, wherein the discharging circuit is coupled to the capacitor at least until the voltage across the capacitor is substantially equal to or less than the second voltage value.

11. The in-circuit tester of claim 10, wherein the actions (a) and (b) are repeated a predetermined number of times.

12. The in-circuit tester of claim 9, wherein the charging circuit further comprises a charging impedance having a second value, wherein when the charging circuit is coupled to the capacitor, the capacitor is charged by the voltage source through the charging impedance.

13. The in-circuit of claim 9, wherein the capacitance-determining block further comprises:
  a) A frequency-to-voltage converter that converts the frequency of the output signal to a representative voltage;
  b) an analog-to-digital converter that converts the representative voltage to a digital value; and
  c) a digital value-processing block that determines the capacitance from the digital value.

14. The in-circuit tester of claim 13, wherein the representative voltage is electrically isolated from the voltage source.

15. The in-circuit tester of claim 14, wherein the digital value-processing block compares determined capacitance to an expected capacitance and outputs a response based on a difference between the determined capacitance and the expected capacitance.

16. The in-circuit tester of claim 15, wherein the response comprises an indication that the determined capacitance differs from the expected capacitance by more than a predetermined amount.

* * * * *

UNITED STATES PATENT AND TRADEMARK OFFICE
CERTIFICATE OF CORRECTION

PATENT NO.         : 7,173,438 B2                                            Page 1 of 1
APPLICATION NO. : 11/132138
DATED              : February 6, 2007
INVENTOR(S)        : Pooranampillai Samua Pooranakaran et al.

It is certified that error appears in the above-identified patent and that said Letters Patent is hereby corrected as shown below:

Column 9, Line 2, "302 separates a first circuit 304 from a second circuit 306" should read -- 302 separates a first circuit 304 from a second circuit 306. --

Column 11, Line 38, "expected or known capacitances." should read -- expected or known capacitance. --

Column 15, Line 10, "capacitance of the capacitor; and" should read -- capacitance of the capacitor; --

Signed and Sealed this

Eighth Day of December, 2009

David J. Kappos
*Director of the United States Patent and Trademark Office*